United States Patent [19]
Tokashiki et al.

[11] Patent Number: 5,624,583
[45] Date of Patent: Apr. 29, 1997

[54] METHOD OF MANUFACTURING SEMICONDUCTOR DEVICE

[75] Inventors: Ken Tokashiki; Kiyoyuki Sato, both of Tokyo, Japan

[73] Assignee: NEC Corporation, Tokyo, Japan

[21] Appl. No.: 523,896

[22] Filed: Sep. 6, 1995

[30] Foreign Application Priority Data

Sep. 7, 1994 [JP] Japan ................................ 6-213908

[51] Int. Cl.$^6$ ................................................ H01L 21/302
[52] U.S. Cl. ........................ 438/720; 216/76; 216/75; 156/643.1; 438/722
[58] Field of Search ........................ 216/67, 76, 75; 156/643.1, 646.1

[56] References Cited

U.S. PATENT DOCUMENTS

| | | | |
|---|---|---|---|
| 5,236,550 | 8/1993 | Abt et al. | 156/643 |
| 5,254,217 | 10/1993 | Maniar et al. | 156/656 |
| 5,382,320 | 1/1995 | Desu et al. | 156/643 |
| 5,407,855 | 4/1995 | Maniar et al. | 437/60 |

OTHER PUBLICATIONS

"Plasma Etching of $RuO_2$ Thin Films," by Shinji Saito et al., Jpn. J. Appl. Phys., vol. 31, 1992, pp. 135–138.

"Decomposition and Product Formation in Tetrafluoromethane—Oxygen Plasma Etching Silicon in the Afterglow"; Beenakker et al., 1981; J. Appl. Phys., 52(1); abstract only.

Primary Examiner—R. Bruce Breneman
Assistant Examiner—George Goudreau
Attorney, Agent, or Firm—Popham Haik Schnobrich & Kaufman, Ltd.

[57] ABSTRACT

A method of manufacturing a semiconductor device containing a ruthenium oxide includes the step of dry-etching the ruthenium oxide using a gas mixture containing oxygen or ozone gas and at least one material selected from the group consisting of fluorine gas, chlorine gas, bromine gas, iodine gas, a halogen gas containing at least one of the fluorine, chlorine, bromine, and iodine gases, and a hydrogen halide.

12 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device, capable of micropatterning a ruthenium oxide and ruthenium.

2. Description of the Prior Art

In recent years, the research and development of microelectronics devices (e.g., a dynamic random access memory (DRAM)) using a typical conductive oxide ($RuO_2$, $IrO_2$, $OsO_2$, or $RhO_2$) having a rutile structure have advanced. In the manufacture of such microdevices, the developments of film formation techniques for conductive oxides and process techniques such as micropatterning for forming devices are indispensable.

A technique for micropatterning $RuO_2$ of the conductive oxides utilizing plasma etching using an oxygen gas plasma (e.g., U.S. Pat. No. 5,254,217 (Oct. 19, 1993) and reactive ion etching using tetrafluoromethane ($CF_4$) gas added to oxygen (e.g., "Plasma Etching of $RuO_2$ Thin Films", Jpn. J. Appl. Phys. vol. 31, (1992), pp. 135–138) are known. In the plasma etching using an oxygen gas plasma, the pressure was kept at 45 mTorr, the oxygen flow rate was set to 50 sccm, and the 13.56-MHz, 200-W RF power was supplied (at this time, a DC bias generated in a lower electrode was 516 V). The etching rate was 57 Å/min. In the reactive ion etching using the $CF_4$ gas added to oxygen, the pressure was kept at 40 mTorr, the 13.56-MHz, 150-W power was supplied, and the total gas flow rate was 30 sccm. The etching rate of 50 to 100 Å/min was obtained in the range of 0 to 50% of $CF_4$.

In an $RuO_2$ micropatterning process of a conventional method of manufacturing a semiconductor device, when plasma etching using an oxygen gas plasma is employed or even when reactive ion etching using $CF_4$ added to oxygen is employed, the etching rate is a maximum of 100 Å/min or less. Satisfactory productivity cannot be obtained in the manufacture of semiconductor devices containing ruthenium oxides and ruthenium. An etching mask material (e.g., a resist, and a so-called hard mask such as a silicon oxide film, a silicon nitride film, and any other metal material) is etched at an etching rate equal to or higher than that of $RuO_2$ in reactive ion etching or physical sputtering. An etching ratio of $RuO_2$ to a mask material, i.e., a selectivity ratio may be expected to be as low as x1.

BRIEF SUMMARY OF THE INVENTION

The present invention has been made in consideration of the above situation, and has as its object to provide a method of manufacturing a semiconductor device, capable of easily realizing etching at a high etching rate and a high selectivity ratio in micropatterning a ruthenium oxide and ruthenium by dry etching and manufacturing a semiconductor device with high productivity.

In order to achieve the above object according to the first and second aspects, there is provided a method of manufacturing a semiconductor device containing a ruthenium oxide, comprising the step of dry-etching the ruthenium oxide using a gas mixture containing oxygen or ozone gas and at least one material selected from the group consisting of fluorine gas, chlorine gas, bromine gas, iodine gas, a halogen gas containing at least one of the fluorine, chlorine, bromine, and iodine gases, and a hydrogen halide.

According to the third aspect of the present invention, there is provided a method of manufacturing a semiconductor device, comprising the step of dry-etching the ruthenium oxide using a gas containing at least one material selected from the group consisting of ozone gas, oxygen fluoride gas, chlorine oxide gas, and iodine oxide gas.

According to the fourth to sixth aspects of the present invention, there is provided a method of manufacturing a semiconductor device containing ruthenium, comprising the step of dry-etching the ruthenium using a gas system used in dry-etching the ruthenium oxide described in the first to third aspects.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

The present invention will be described in more detail with reference to the accompanying drawings.

First of all, the principle of the present invention will be described below.

Figure 1:
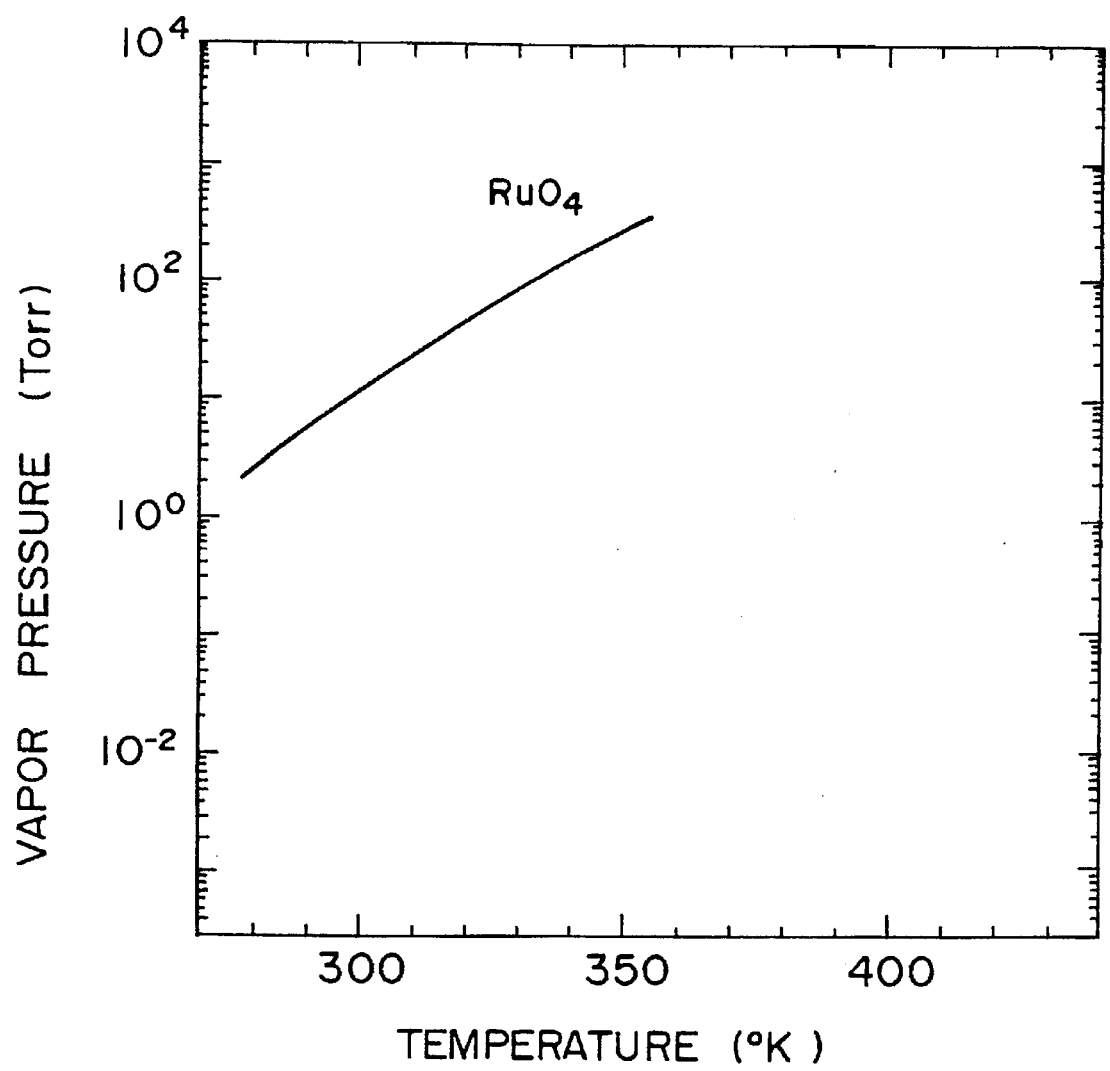
FIG. 1 is a graph showing the saturation vapor pressure curve of $RuO_4$.

$RuO_2$ is oxidized by reactive ion etching using an oxygen gas plasma to produce reaction products (e.g., $RuO_3$ and $RuO_4$ having the oxidation numbers of +VI and +VIII) having high saturation vapor pressures. For example, the saturation vapor pressure curve of the reaction product $RuO_4$ is shown in FIG. 1. Referring to FIG. 1, in general, in a dry etching apparatus evacuated to 1 Torr or less, the reaction product $RuO_4$ is found to be easily evaporated at room temperature. When this evaporation progresses, etching progresses. The above example can be expressed by chemical formula (1) below:

$$RuO_2 + O_2 = RuO_4 \qquad (1)$$

When a halogen gas is added to the oxygen gas plasma, a halogen oxide having a very high oxidation power is expected to be produced in the plasma gas phase or on the $RuO_2$ surface. For example, if the halogen gas is of a fluorine system, oxygen fluoride is produced; if the halogen gas is of a chlorine system, chlorine oxide is produced; if the halogen gas is of a bromine system, bromine oxide is produced; and if the halogen gas is of an iodine system, iodine oxide is produced. These halogen oxides can increase the Ru oxidation number from +IV to +VI and +VIII, thereby producing reaction products $RuO_3$ and $RuO_4$. For example, chlorine gas is selected as a halogen gas, one of the chlorine oxides expected to be produced in the plasma gas phase or on the $RuO_2$ surface is $ClO_2$, and this chemical reaction is represented by chemical formula (2) below:

$$RuO_2 + ClO_2 = RuO_4 + \tfrac{1}{2}Cl_2 \qquad (2)$$

That is, $ClO_2$ having a high oxidation power can easily oxide $RuO_2$ into $RuO_4$, and $RuO_4$ is evaporated to progress etching. During etching, chlorine atoms are converted into chlorine gas which is then discharged outside the etching chamber.

Figure 2:
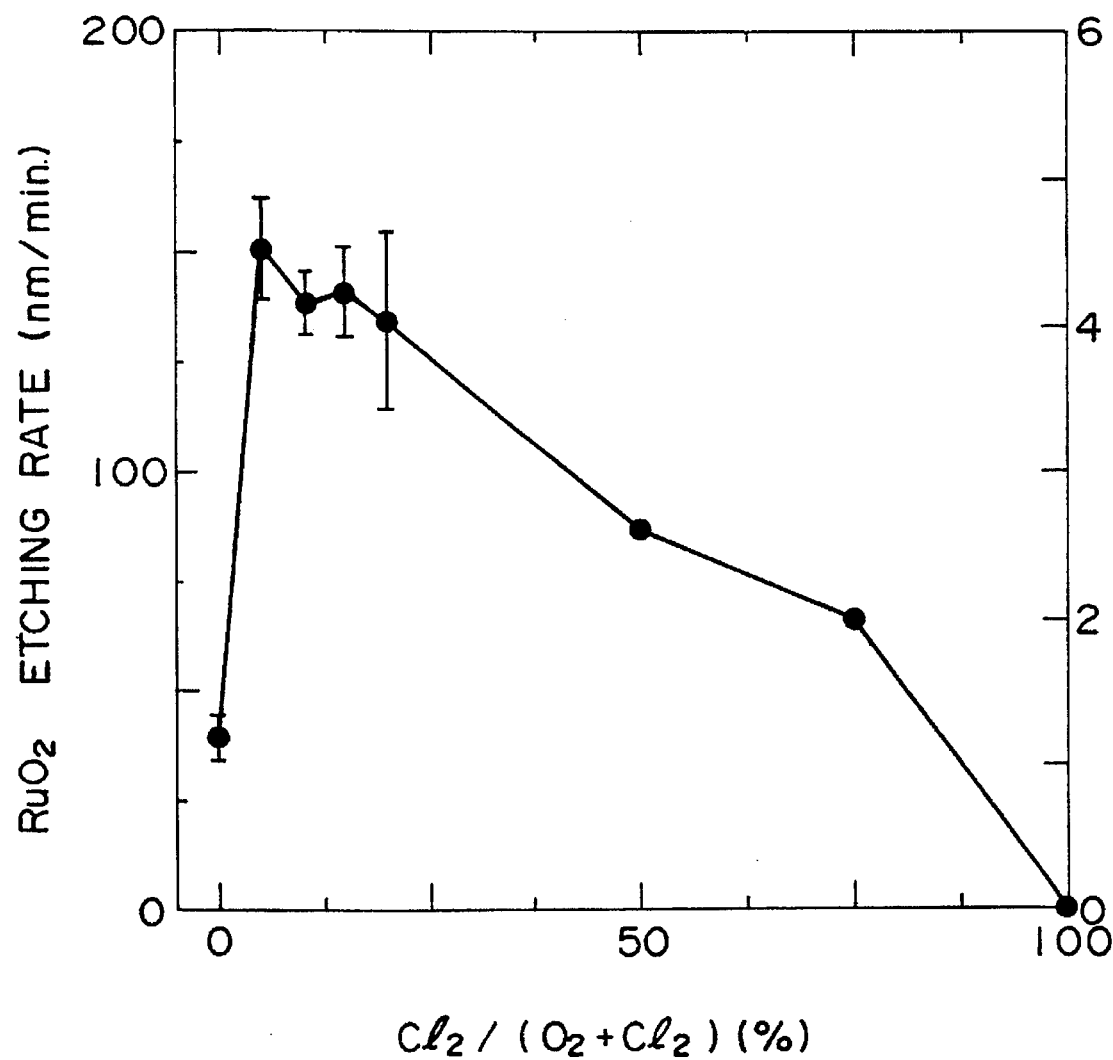
FIG. 2 is a graph showing the $RuO_2$ etching rate characteristics with respect to the chlorine content when chlorine is added to oxygen gas.

The reaction rate of the direct reaction between $RuO_2$ and $O_2$ represented by formula (1) is compared with that of the reaction through the chlorine oxide, as represented by formula (2). FIG. 2 experimentally shows the $RuO_2$ etching rate characteristics with respect to the chlorine content when chlorine gas is added in oxygen gas. As is apparent from FIG. 2, when chlorine is added in 5%, the $RuO_2$ etching rate abruptly increases. The $RuO_2$ etching rate is three times that obtained in the oxygen gas plasma in the range of the chlorine content of 5% to 20%. This indicates that the rate of the reaction through the chlorine oxide represented by formula (2) is much higher than that of the direct reaction using oxygen represented by formula (1).

Figure 3:
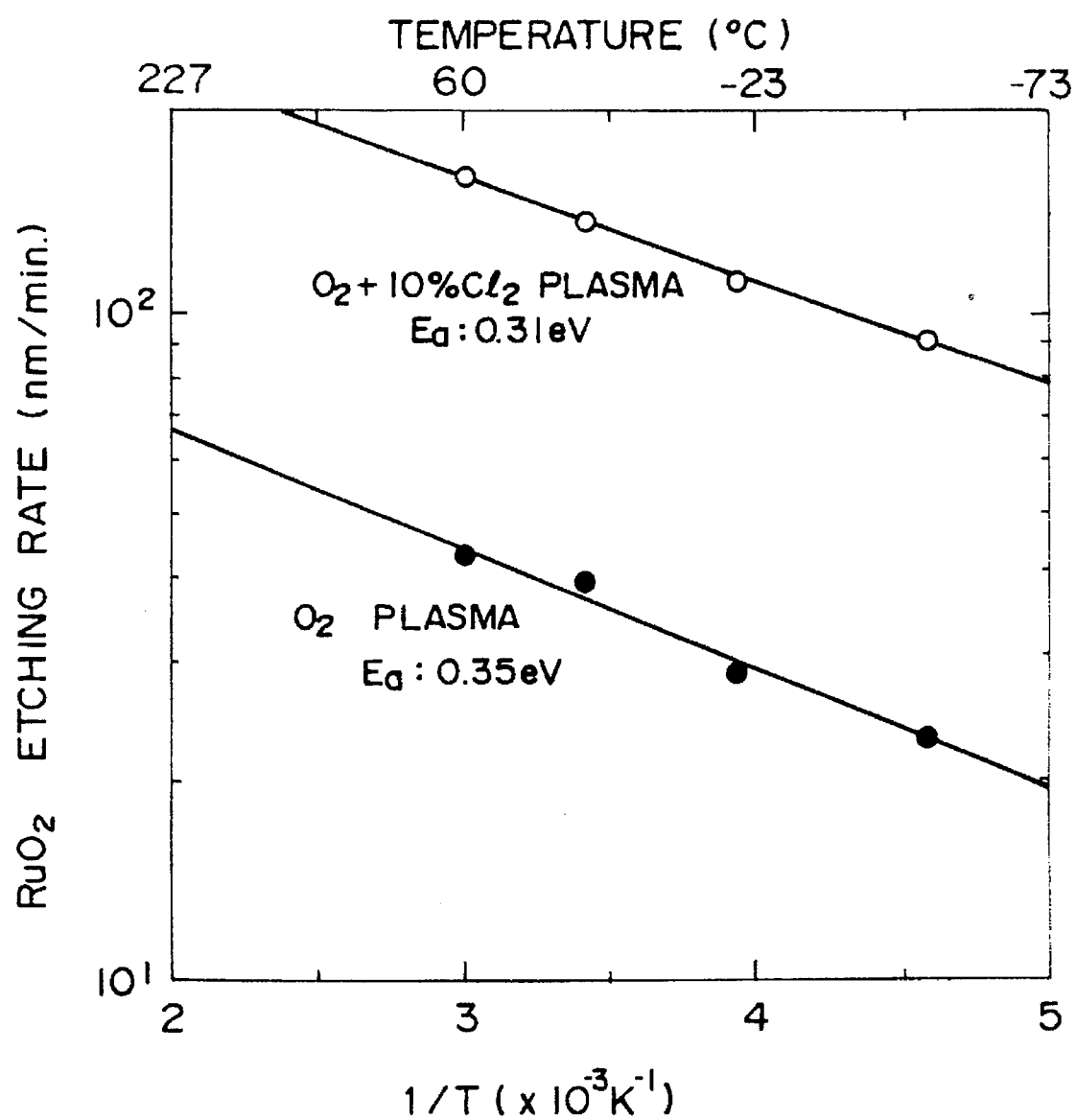
FIG. 3 is a graph showing the $RuO_2$ etching rate characteristics and the $RuO_2$ activation energy value with respect to the substrate temperature when chlorine is added in 10% to oxygen gas and when no chlorine gas is added to oxygen gas.

A chemical reaction rate R is generally expressed by equation (3) below:

$$R = A \exp(-E_a / kT) \qquad (3)$$

where A is the frequency factor, $E_a$ is the activation energy, k is the Boltzmann constant, and T is the absolute temperature. The reaction rate is determined by the activation energy $E_a$ and the frequency factor A. In dry etching, the etching rate is regarded to be equal to the chemical reaction rate R. The activation energy of the reaction through the chlorine oxide represented by formula (2) can be experimentally and directly obtained. FIG. 3 shows the substrate temperature dependences, i.e., Arrhenius curves when $RuO_2$ is etched using an oxygen gas plasma and a plasma added with 10% of chlorine. The apparent activation energy obtained from FIG. 3 was 0.35 eV in the oxygen gas plasma and 0.31 eV in the plasma added with 10% of chlorine. That is, no significant difference in activation energy is found between etching using the oxygen gas plasma and etching using the plasma added with 10% of chlorine. A large difference in reaction rate between formulas (1) and (2) depends on a difference in frequency factor A. The frequency factor A is proportional to the concentration of the reaction system and the reaction probability or cross-section of reaction. In this principle, the cross-section of reaction dominates the $RuO_2$ etching rate. That is, the cross-section of reaction for increasing the Ru oxidation number from +IV to +VI and +VIII depends on the oxidation power. For example, the standard oxidation reduction potential of oxygen in formula (1) is compared with that of $ClO_2$ as the chlorine oxide in formula (2), as shown in Table 1 below, on the basis of "Chemical Hand-book: Fundamental Part II" (1966) issued from Maruzen, Japan.

TABLE 1

| Reaction | Oxidation/Reduction Potential (V) |
|---|---|
| $ClO_2 + e = ClO_2^-$ | 1.16 |
| $O_2 + e = O_2^-$ | −0.56 |

In Table 1, e represents an electron. As can be apparent from Table 1, the oxidation/reduction potential of the chlorine oxide is much higher than that of oxygen. That is, the chlorine oxide has a higher oxidation power than that of oxygen. This large difference in oxidation power results in a large difference in reaction rate between formulas (1) and (2).

When a gas having a higher oxidation power is used in dry etching, $RuO_4$ is produced in a larger amount, and $RuO_4$ is evaporated from the $RuO_2$ surface in accordance with the saturation vapor pressure curve shown in FIG. 1. In the above description, as a method of obtaining a halogen oxide in the plasma gas phase or on the $RuO_2$ surface, a gas mixture of oxygen and a halogen gas is used. However, the halogen oxide gas itself can be used as an etching gas. In addition, as another gas having a high oxidation power, ozone gas or a gas mixture of ozone gas and a halogen-based gas can be expected to be applied as an etching gas in accordance with the above principle.

Figure 4:
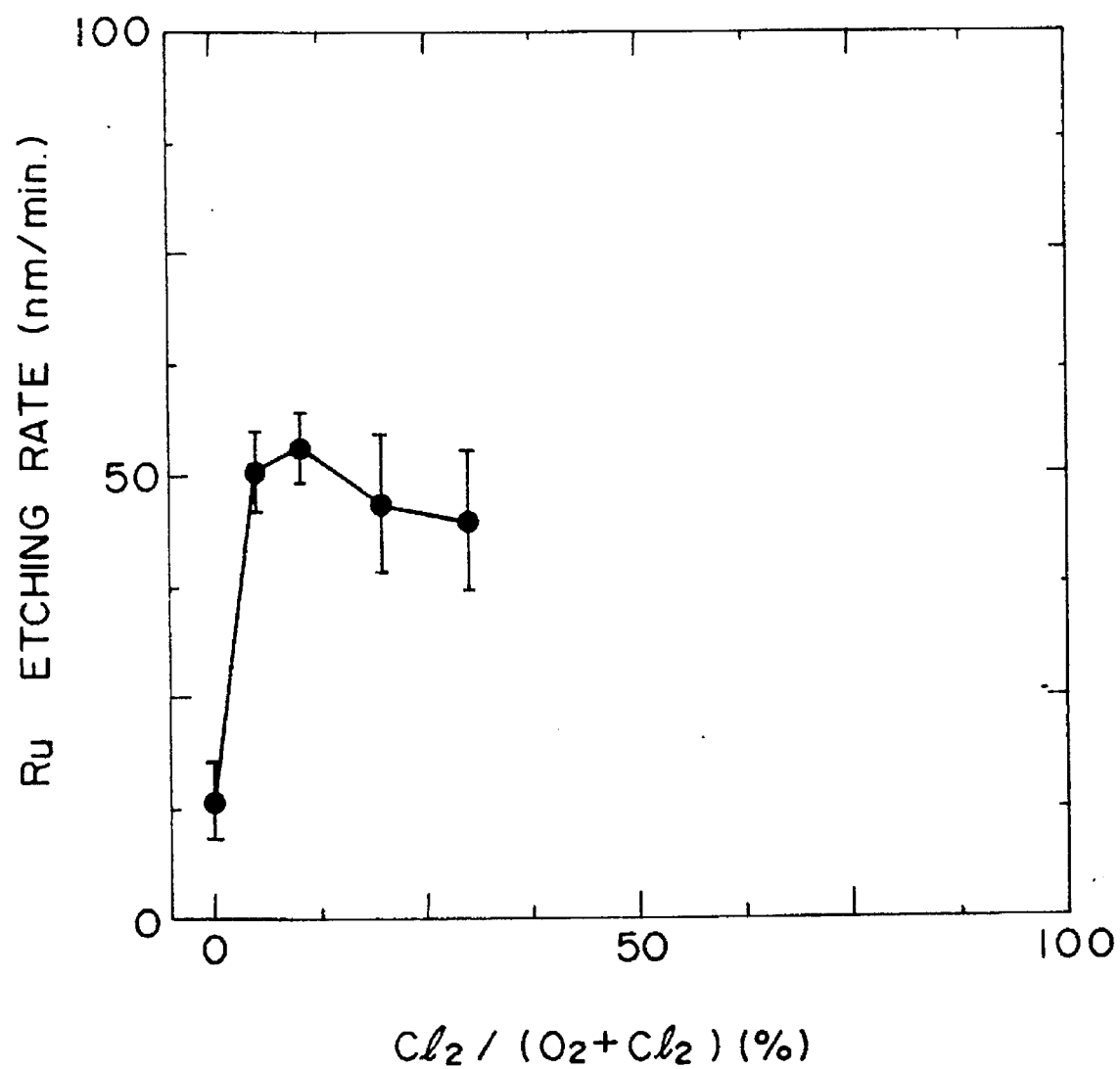
FIG. 4 is a graph showing the Ru etching rate characteristics with respect to the chlorine content when chlorine is added to oxygen gas.

The above principle also applies to Ru etching. Ru can be dry-etched in an oxygen gas plasma. It is supposed that Ru is oxidized into $RuO_3$ or $RuO_4$ which is then evaporated. On the other hand, a chemical reaction having a high reaction rate represented by formula (2) and equation (3) can be expected on the Ru surface by adding a halogen gas to oxygen. In fact, FIG. 4 shows the relationship between the Ru etching rate and the content of chlorine in the gas mixture of oxygen and chlorine gas. The same result as in FIG. 2 for $RuO_2$ can be obtained. That is, the above principle can apply to Ru dry etching.

The above principle can satisfactorily apply to a ruthenium alloy material containing a metal element (e.g., Al, Si, or Cu) in the ruthenium oxide and ruthenium due to the following reason. For example, in Japanese Unexamined Patent Publication No. 2-74006, in dry-etching a binary ruthenium oxide Ru-Si-O or Ru-Al-O using an oxygen gas plasma, when a composition ratio of elements except for oxygen atoms to Ru is 10 at % or less, an etching rate almost equal to that of $RuO_2$ can be obtained.

EXAMPLE 1

Figure 5A:
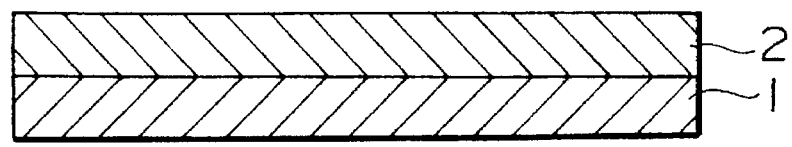
FIGS. 5A to 5D are sectional views showing the process steps in manufacturing a semiconductor device according to Example 1 of the present invention.
Figure 5B:
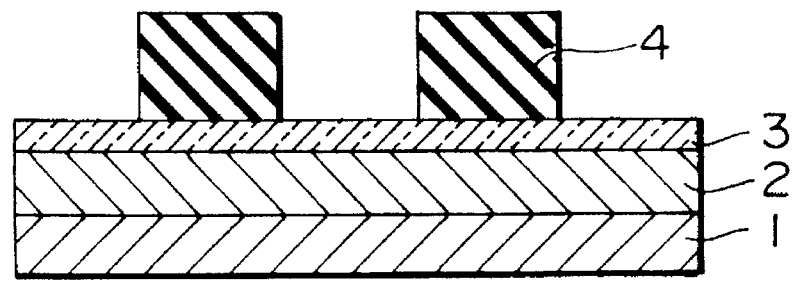
Figure 5C:
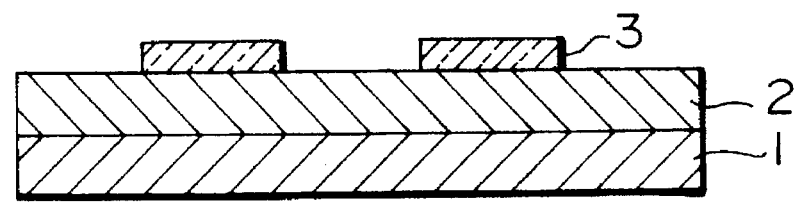
Figure 5D:
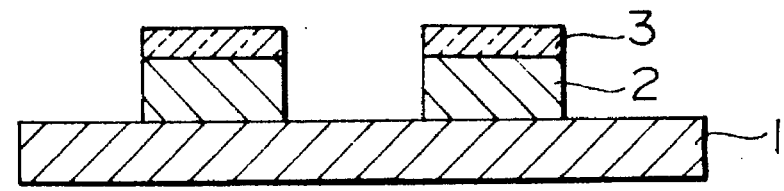

A 400-nm thick $RuO_2$ film 2 was formed on a silicon substrate 1 by sputtering (FIG. 5A). A 200-nm thick spin-on-glass (SOG) film 3 was formed on the $RuO_2$ film by a spin coater. A photo-active compound was applied to the SOG film 3 and patterned into a resist pattern 4 using an optical exposure system (FIG. 5B). The SOG film 3 was formed into a desired pattern using an ECR (Electron Cyclotron Resonance) dry etching apparatus. The etching conditions were as follows: $CHF_3$ gas was supplied at 40 sccm, the pressure was 10 mTorr, the microwave power was 500 W, and the 2-MHz RF power applied to the substrate was 150 W. The resist pattern 4 was ashed by oxygen gas plasma ashing to completely remove the resist pattern 4, thereby forming an etching mask consisting of the SOG film 3 (FIG. 5C). The $RuO_2$ film was formed into a desired pattern using a gas mixture plasma of oxygen gas and chlorine gas. The etching conditions were as follows: the total gas flow rate was 172 sccm, the chlorine content was set to 10%, the pressure was 15 mTorr, the microwave power was 220 W, the 2-MHz RF power applied to the substrate was 150 W, and the substrate temperature was 20° C. As a result, the etching selectivity of the $RuO_2$ film 2 to the SOG film 3 was 5 times. The etching rate of the $RuO_2$ film was 150 nm/min, and the shape of the etched $RuO_2$ film was anisotropic (FIG. 5D).

EXAMPLE 2

Figure 6:
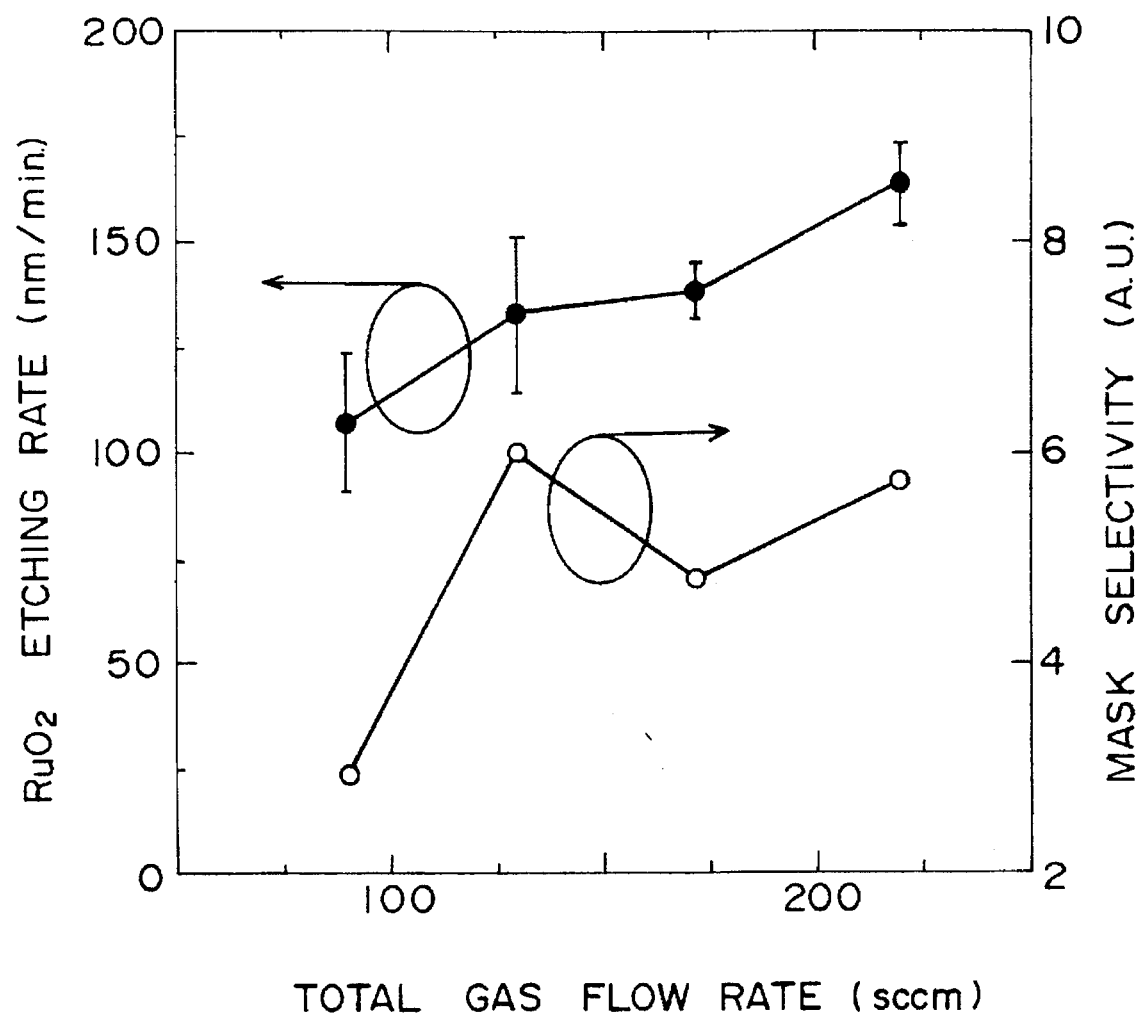
FIG. 6 is a graph showing the $RuO_2$ etching rate characteristics with respect to the total gas flow rate according to Example 2 of the present invention.

Changes in etching selectivity of an $RuO_2$ film 2 to an SOG film 3 with changes in only total gas flow rate as 90, 130, 172, and 220 sccm, using a sample having the same film structure as in Example 1 and the same apparatus as in Example 1 under the same conditions as in Example 1 are shown in FIG. 6. The etching rate of the $RuO_2$ film and the selectivity are found to increase with an increase in total gas flow rate. In addition, the shape of the etched $RuO_2$ film was anisotropic at each gas flow rate.

EXAMPLE 3

Figure 7:
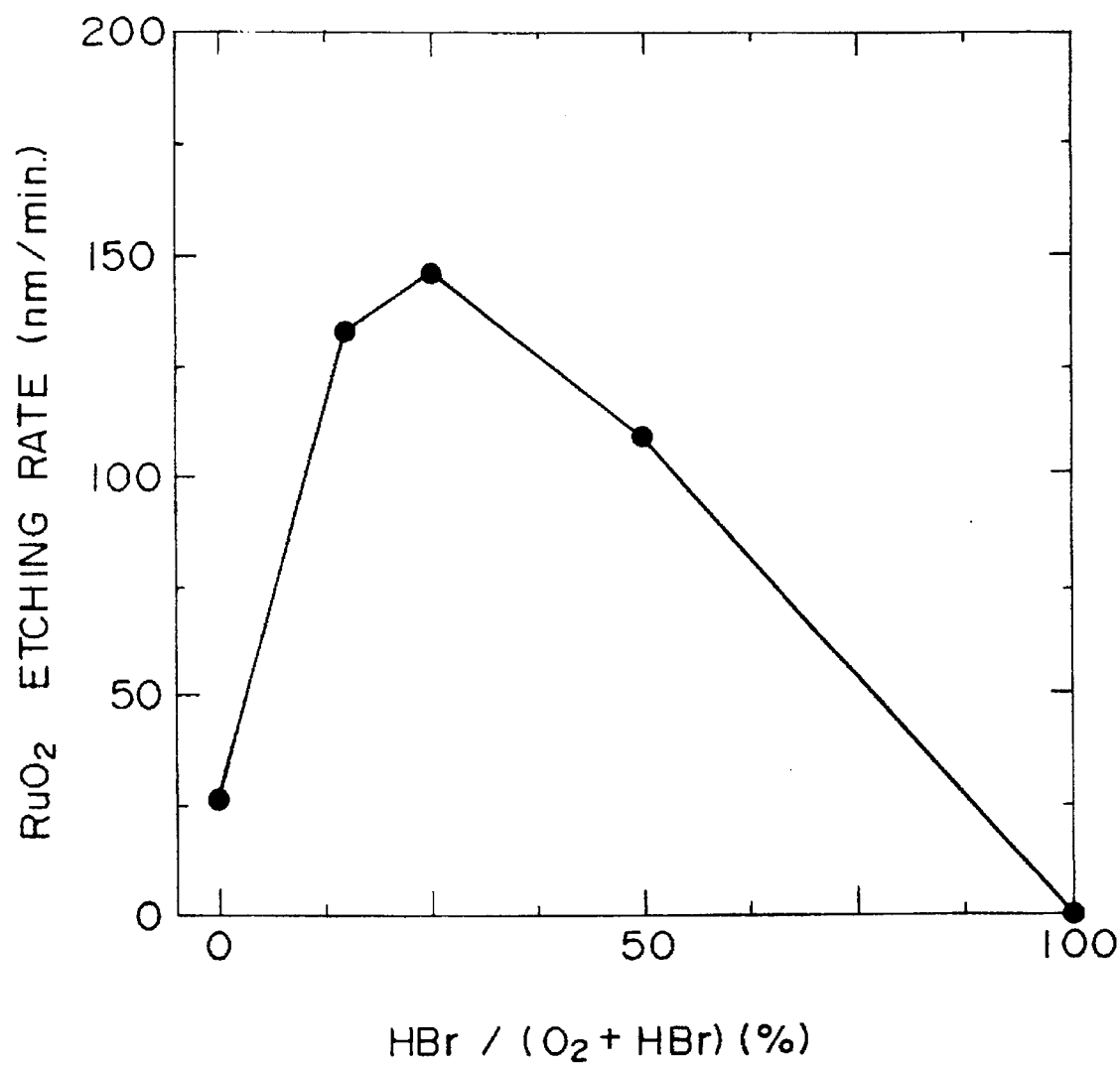
FIG. 7 is a graph showing the $RuO_2$ etching rate characteristics with respect to the content of hydrogen bromide when hydrogen bromide gas is added to oxygen gas according to Example 3 of the present invention.

FIG. 7 shows the relationship between the etching rate of an $RuO_2$ film 2 and the hydrogen bromide gas content when hydrogen bromide gas was added to oxygen gas, using a sample having the same film structure as in Example 1 and the same apparatus as in Example 1. The conditions were as follows: the total gas flow rate was 80 sccm, the pressure was 5 mTorr, the microwave power was 220 W, the 2-MHz RF power applied to the substrate was 50 W, and the substrate temperature was 20° C. As can be apparent from FIG. 7, the etching rate of the $RuO_2$ film was 100 nm/min or more within the range of the hydrogen bromide gas content of 15% to 50%. A maximum etching rate of 147 nm/min was obtained in the content of about 25%. The shape of the etched $RuO_2$ film was anisotropic.

EXAMPLE 4

Figure 8A:
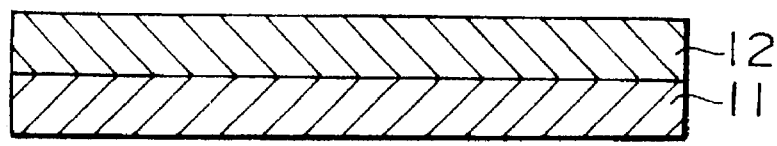
FIGS. 8A to 8D are sectional views showing the process steps in manufacturing a semiconductor device according to Example 4 of the present invention.
Figure 8B:
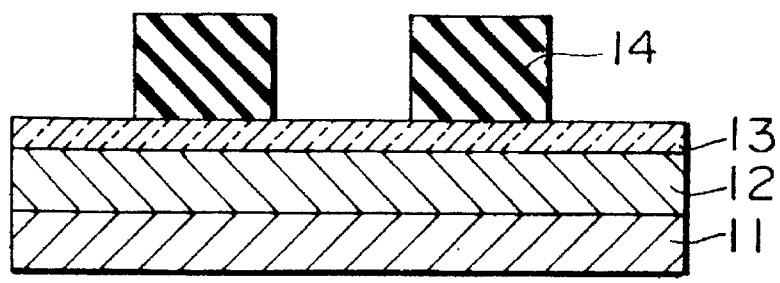
Figure 8C:
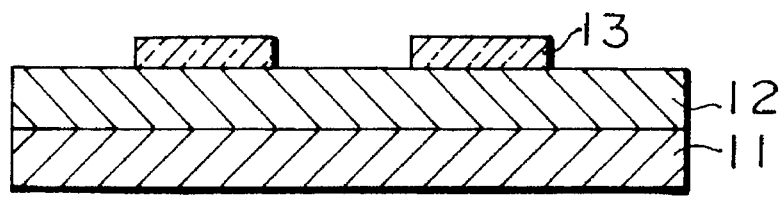
Figure 8D:
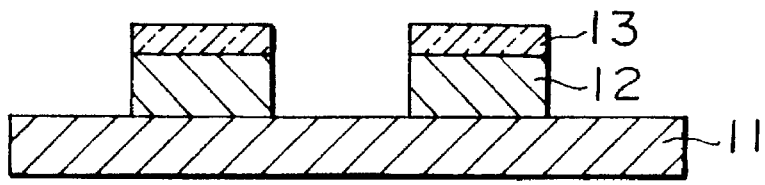

A 200-nm thick Ru film 12 was formed on a silicon substrate 11 by sputtering (FIG. 8A). A 200-nm thick spin-on-glass (SOG) film 13 was formed on the Ru film by a spin coater. A photo-active compound was applied to the SOG film 13 and patterned into a resist pattern using an optical exposure system (FIG. 8B). The SOG film 13 was formed into a desired pattern using an ECR (Electron Cyclotron Resonance) dry etching apparatus. The etching conditions were identical to those of Example 1. A resist pattern 14 was ashed by oxygen gas plasma ashing to completely remove the resist pattern 14, thereby forming an etching mask consisting of the SOG film 13 (FIG. 8C). The Ru film was formed into a desired pattern using a gas mixture plasma of oxygen gas and chlorine gas. The etching conditions were as follows: the total gas flow rate was 172 sccm, the chlorine content was set to 10%, the pressure was 15 mTorr, the microwave power was 220 W, the 2-MHz RF power applied to the substrate was 150 W, and the substrate temperature was 20° C. As a result, the etching selectivity ratio of the Ru film 12 to the SOG film 13 was 2 times. The etching rate of the resultant Ru film was 53 nm/min, and the shape of the etched Ru film was anisotropic (FIG. 8D).

In each example described above, chlorine or hydrogen bromide gas is used as a halogen gas. However, a halogen gas may consist of at least one material selected from the group consisting of fluorine gas, bromine gas, iodine gas, a halogen gas containing at least one of the fluorine, bromine, and iodine gases, and another hydrogen halide gas. Ozone gas may be mixed with this halogen gas in place of oxygen gas.

In addition, at least one gas selected from the group consisting of ozone gas, oxygen fluoride gas, chlorine oxide gas, and iodine oxide gas may be similarly used.

The constitution of each example is merely illustrative, and the method of manufacturing a semiconductor device according to the present invention naturally includes modified and changed methods of manufacturing semiconductor devices.

What is claimed is:

1. A method of manufacturing a semiconductor device containing a ruthenium oxide, comprising the step of dry-etching the ruthenium oxide using a mixture of gases comprising oxygen gas and at least one gas selected from the group consisting of fluorine gas, chlorine gas, bromine gas, and iodine gas, a halogen bearing gas containing at least one of the fluorine, chlorine, bromine, and iodine atoms and which does not contain carbon atoms, and a hydrogen halide gas.

2. A method of manufacturing a semiconductor device containing a ruthenium oxide, comprising the step of dry-etching the ruthenium oxide using a mixture of gases comprising ozone gas and at least one gas selected from the group consisting of fluorine gas, chlorine gas, bromine gas, and iodine gas, a halogen bearing gas containing at least one of the fluorine, chlorine, bromine, and iodine atoms and which does not contain carbon atoms, and a hydrogen halide gas.

3. A method of manufacturing a semiconductor device containing a ruthenium oxide, comprising the step of dry-etching the ruthenium oxide using at least one gas selected from the group consisting of oxygen fluoride gas, chlorine oxide gas, and iodine oxide gas.

4. A method of manufacturing a semiconductor device containing ruthenium, comprising the step of dry-etching the ruthenium using a mixture of gases comprising oxygen gas and at least one gas selected from the group consisting of fluorine gas, chlorine gas, bromine gas, and iodine gas, a halogen bearing gas containing at least one of the fluorine, chlorine, bromine, and iodine atoms and which does not contain carbon atoms, and a hydrogen halide gas.

5. A method of manufacturing a semiconductor device containing ruthenium, comprising the step of dry-etching the ruthenium oxide using a mixture of gases comprising ozone gas and at least one gas selected from the group consisting of fluorine gas, chlorine gas, bromine gas, and iodine gas, a halogen bearing gas containing at least one of the fluorine, chlorine, bromine, and iodine atoms and which does not contain carbon atoms, and a hydrogen halide gas.

6. A method of manufacturing a semiconductor device containing ruthenium, comprising the step of dry-etching the ruthenium using at least one gas selected from the group consisting of oxygen fluorine gas, chlorine oxide gas, and iodine oxide gas.

7. A method of manufacturing a semiconductor device comprising a material selected from the group consisting of ruthenium or ruthenium oxide, comprising the step of dry-etching the ruthenium or the ruthenium oxide using a mixture of gases comprising a first gas selected from the group consisting of oxygen gas and ozone; and a second gas selected from the group consisting of fluorine gas, chlorine gas, bromine gas, iodine gas, oxygen fluoride gas, chlorine oxide gas, iodine oxide gas, and a hydrogen halide gas.

8. The method of claim 7 wherein said material is ruthenium oxide.

9. The method of claim 8 wherein said first gas comprises oxygen gas, said second gas comprises hydrogen bromide, and wherein said dry-etching step has an etch rate of 100 nm/min or more.

10. The method of claim 8 wherein said first gas comprises oxygen and said second gas comprises chlorine gas.

11. The method of claim 7 wherein said material is ruthenium.

12. The method of claim 11 wherein said first gas comprises oxygen gas and said second gas comprises chlorine gas and wherein said dry-etching step has an etch rate of at least about 50 nm/min.

* * * * *